United States Patent [19]

Pommerrenig

[11] 4,451,842

[45] May 29, 1984

[54] LARGE SCALE INTEGRATED FOCAL PLANE

[75] Inventor: Dieter H. Pommerrenig, El Toro, Calif.

[73] Assignee: Rockwell International Corporation, El Segundo, Calif.

[21] Appl. No.: 220,676

[22] Filed: Dec. 29, 1980

[51] Int. Cl.³ .................... H01L 27/14; H01L 29/78; H01L 23/48; H01L 25/04
[52] U.S. Cl. ........................................ 357/30; 357/65; 357/68; 357/83; 357/24
[58] Field of Search .................. 357/24 LR, 30, 30 I, 357/30 D, 30 G, 83, 31, 32, 65, 68, 81; 250/211 J; 370/1, 3

[56] References Cited

U.S. PATENT DOCUMENTS

| | | | |
|---|---|---|---|
| 3,989,946 | 11/1976 | Chapman et al. | 357/30 X |
| 4,197,469 | 4/1980 | Cheung | 357/30 X |
| 4,246,590 | 1/1981 | Thomas et al. | 357/300 R |
| 4,369,458 | 1/1983 | Thomas et al. | 357/300 R |

Primary Examiner—Andrew J. James
Assistant Examiner—J. Carroll
Attorney, Agent, or Firm—Harold C. Weston; H. F. Hamann

[57] ABSTRACT

A photo-electric sensor comprised of a wafer of semiconductor material with a first plurality of photodetectors integral with its rear surface, its front surface being an electrode comprised of a transparent layer of electrically conductive material, has those detectors so spaced apart from each other that the total array can be sampled by a second plurality of charge coupled device multiplexers, each of which multiplexers has its input terminals spaced closer together than are the photodetectors. Each multiplexer input terminal is mechanically and electrically coupled to a photodetector through metallic leads and columns, such leads and columns being so configured as to preclude obtrusion of multiplexer structure into space outside the wafer's lateral extremities, which results in no "dead" space in a focal plane consisting of either one sensor or a plurality thereof abutting each other.

15 Claims, 12 Drawing Figures

LARGE SCALE INTEGRATED FOCAL PLANE

BACKGROUND OF THE INVENTION

1. Field of the Invention

This invention relates to focal planes, and, more particularly, to a focal plane comprised of a transparent substrate with photodetectors integral therewith and having such photodetectors coupled to signal processing equipment through conductors so routed and configured as to provide total usage of the plane for signal generation with no dead space.

2. Description of the Prior Art

Surveillance of earth sites and stratospheric phenomena from space platforms hundreds of miles above earth's surface has become a commercially valuable "fallout" of America's space program. Not only does the everday citizen have the opportunity to view cloud cover, storm patterns and weather fronts with televised evening news features, but population planners, forestry scientists, fisheries managers, geologists in search of mineral reserves and a broad variety of commercial planners depend heavily on data derived from earth scanners and optics transmissions from space to direct commercial ventures involving earth's resources.

Such space observations are presently effected through use of conventional, or modified conventional, television scanners and transmission equipments of appropriate resolution. High resolution, high definition presentation of earth images however, has recently been given renewed priority by military scientists and others dependent on fine details to achieve observance objectives.

Such high resolution systems are typified by that presented in my application Ser. No. 126,134 entitled MULTI-ELEMENT IMAGER DEVICE now U.S. Pat. No. 4,350,886 wherein a plurality of multiplexers operates on given segments of a focal plane to provide detail enchancement of sensed images.

Such systems are known as hybrid types wherein sensor elements and signal processor equipments are electrically coupled together to maximize the number of photosites available for reproduction of a target image. The within invention is of this type but provides maximum resolution of images in its focal plane through elimination of "dead space" used by conventional hybrids for electrically connecting sensors to processor equipments.

Articles discussing these concepts have appeared in technical publications such as the paper by S. P. Emmons, T. F. Cheek, Jr., J. T. Hall, P. W. Van Atta and R. Balcerak, published at pages 43-52, in the proceedings of the International Conference Application of Charge-Coupled Devices, October, 1975, entitled "A CCD Multiplexer with Forty AC Coupled Inputs". U.S. Pat. No. 4,197,469, Capacitively Coupled Array of Photodetectors, by Cheung, and references cited therein, also describe different types of focal plane. Nowhere however, is the concept of "fanned in" interconnection of photosites to CCD MUX inputs presented in the current literature. It is this aspect of the within invention that will be discussed in full by this disclosure.

SUMMARY OF THE INVENTION

An object of this invention is to provide a focal plane of extended dimensions, sensitive to electromagnetic signal energy, having no "dead space", and whose detector substrate is supportive of operational electronics and operating bus lines.

A further object of the invention is to provide such a focal plane, at a low cost, with the capability of producing high resolution response to electromagnetic image signals over the extremes of frequency in that medium.

A further object of this invention is to provide a large area focal plane having an integral detector substrate serving as mechanical support to a plurality of interconnected CCD chips.

A still further object of this invention is to provide a high resolution focal plane module capable of being coupled to other similar modules to provide a large active area focal plane with zero dead space.

Except where specially noted in the text, this disclosure describes a focal plane useable for conversion of infrared image data into electrical signals. It must be noted however, that variations of substrate material, dopant and detector impurity matter provide for its use with signals of various frequency ranges across the electromagnetic spectrum. Specification of elements herein is not to be construed as limitation to those elements specified, but rather that such are typical materials for a plane useable in the infrared signal frequency regime.

A recent development in Infrared (IR) focal planes is the efficient utilization of Charge Coupled Device (CCD) multiplexers with an extrinsic silicon photoconductor substrate as an integrated surveillance system sensor. In such a sensor, a semiconductor material wafer acts as substrate for support of multiplexer units needed to read out detector elements integral to the wafer. Such detector elements have a common infrared transparent electrode 36 facing the incoming signal carrying radiation. They are positioned on the back side of the wafer and consist of discrete p+ regions of "impurity material" coupled to conductors leading to multiplexer input terminals.

Other types of focal plane, for example those utilizing intrinsic material for their substrates and which operate on photo-voltaic detector principles, are comprehended by this invention. Such other types include particle, or quantum counters, for target images in the extremely high frequency portion of the spectrum. Where detector elements, viz. photosites or pixels of these planes, are spaced farther apart than input terminals of the associated multiplexers, the singularly advantageous condition arises wherein signal leads from such pixels may be "fanned in" to multiplexer input terminals so that multiplexer structure does not intrude into the "sensing" area. A totally active or "zero dead space" sensing plane results. Limits of focal plane resolution are thus set by the limit on spacing of multiplexer input terminals and not by physical dimensions of the multiplexers proper.

The device described here is optically responsive over the full sensing surface of the semiconductor wafer while readout chips and bus lines are integral with its back side. Such an arrangement allows the sensed target image to be reproduced electrically in sections of the plane served by the multiplexers mounted on its back surface. This can be achieved for application wherein pixel spacing is on the order of 125 microns since suitable, conventional CCD multiplexers have input terminal spacings of 88 microns or less.

In addition, cryogenic cooling, a serious problem in early infrared focal planes, is more efficient and troublefree in this large scale integrated (LSI) focal plane because of a simple, short thermal path between a cold sink 56 and its detector pixels 60. Detector to CCD interconnects are sandwiched between dielectric layers of silicon dioxide to achieve electrical isolation from the detector wafer underneath and the bus line structure above, while the entire array is contiguous and provides a dependable path for conductive heat transfer from detectors to the cold plate. Such cooling means are generally not required for focal planes utilizing photovoltaic detectors for visible light images or for higher frequency electromagnetic image sensing.

Two types of infrared focal plane are presently under study for surveillance system use. The first, a monolithic doped silicon IR CCD, utilizes a large number of identical circuits on the same chip so that the total array perform a system or subsystem function. Such monolithic chips require standard bonding interconnection to signal processing equipments, which demands, in turn, appreciable "dead space" between individual devices. It is considered axiomatic by experts in this field that monolithic arrays will require extensive research and development to overcome such problems as process optimization and the unacceptable cost/yield ratio presently encountered in their manufacture.

The other type of IR focal plane is known as a hybrid array and consists of a sensing or detecting medium separate from, but coupled electrically to, signal processing equipments. The within disclosure presents a device of this latter type. The sensing medium comprises a properly doped substrate of semiconductor material with integral detectors, electrically and mechanically connected to CCD multiplexers which then function as part of such substrate.

The hybrid approach benefits from separability of components wherein it is possible to develop and optimize the sensing and signal processing equipments independently.

The hybrid LSI focal plane described herein has the following advantages over its monolithic counterpart:

It provides an extrinsic silicon hybrid focal plane module a plurality of which which can be assembled into a two-dimensional focal plane.

Standard large-scale integration and micro-electronic bonding techniques are used for the assembly; no new technologies need be developed.

The interconnect address line pattern is redundant so that an open line circuit failure in a given address line does not effect the operation of devices tapped to that line.

Detector material performance and CCD's can be optimized independently.

Such a plane is amenable to automated assembly providing a favorable cost and yield in production quantities.

An integral detector wafer serves as substrate to support multiplexer chips needed to read out detector elements. These detector elements have a common, infrared transparent electrode 36 facing incoming signal radiation and consist of discrete p+ islands 58 on the rear side of the detector wafer. Electrode 36 provides for maintenance of proper bias voltages on detectors embedded in the rear surface of the wafer. If, however, an n type photoconductive substrate is used, islands and transparent electrode must be of n+ type material. The invention electrically connects each of these p+ (or n+) islands to an input terminal of a two-dimensional CCD multiplexer chip. In addition, bus lines on the rear side of the wafer provide clock and bias voltages to the multiplexer chips at pads 34 and route video output of each chip to signal processor equipments. Detector to CCD interconnects consist of carefully designed aluminum, or other deposited material conductive strips 86, sandwiched between dielectric layers 40, 42 and so routed, in a "fan in" fashion, as to achieve electrical insulation from each other, the detector wafer underneath, and the bus lines above.

When the wafer, with its associated detectors, is placed in the focal plane of an infrared optics system, images presented on its sensing surface are converted to digital type electrical signals at the pixels of its rear surface. Intensity, or level, of these signals is proportional to the intensity of target signal energy falling on the corresponding pixels. Function of the CCD multiplexer is to sample these pixels sequentially and convert voltages there to a time ordered serial pulse train for processing by other equipments into the data desired from the system. Such data may well be a reconstituted presentation of the target image, in which case signal conditioners convert the serial pulse train to a format compatible with presentation of the scene sampled by the multiplexer. Electronic filtering, computerized selection of data bits and other conditioning may well be involved here.

This focal plane is optically responsive over its entire area. Readout chips and bus lines are placed on the back side of the detector wafer, away from incoming signal radiation. This can be achieved where detectors are spaced apart on centers of more than 125 microns because CCD cells of conventional multiplexers used with the embodiments described herein have input terminal spacing of approximately 88 microns. Detectors can be formed over the entire rear surface of the wafer to extend along each edge thereof through use of "state-of-the-art" etching/deposition techniques, providing reliable uniform response from uniformly spaced pixels. A significant feature of the invention exists in the placement and routing of metallic conductors 86 between detector elements (pixels, photosites) and selected positions corresponding to the locations of input terminals of the CCD multiplexer associated with those detectors. A column of conductive material 54 is formed between the two positions and they are "flip chip" bonded together so that pixels and multiplexer are attached physically together for electrical connection and mechanical support.

Since center-to-center spacing of the p+ islands, viz. pixels, on the detector wafer must be larger than that of the input terminals on the CCD multiplexers, a two-dimensional "fan-in" of conductor leads is required to connect each detector to its proper CCD input.

Some preferred embodiments of such a focal plane will be described in the following specification. The drawings described below will illustrate features of such specification.

DESCRIPTION OF PREFERRED EMBODIMENTS

Figure 1:
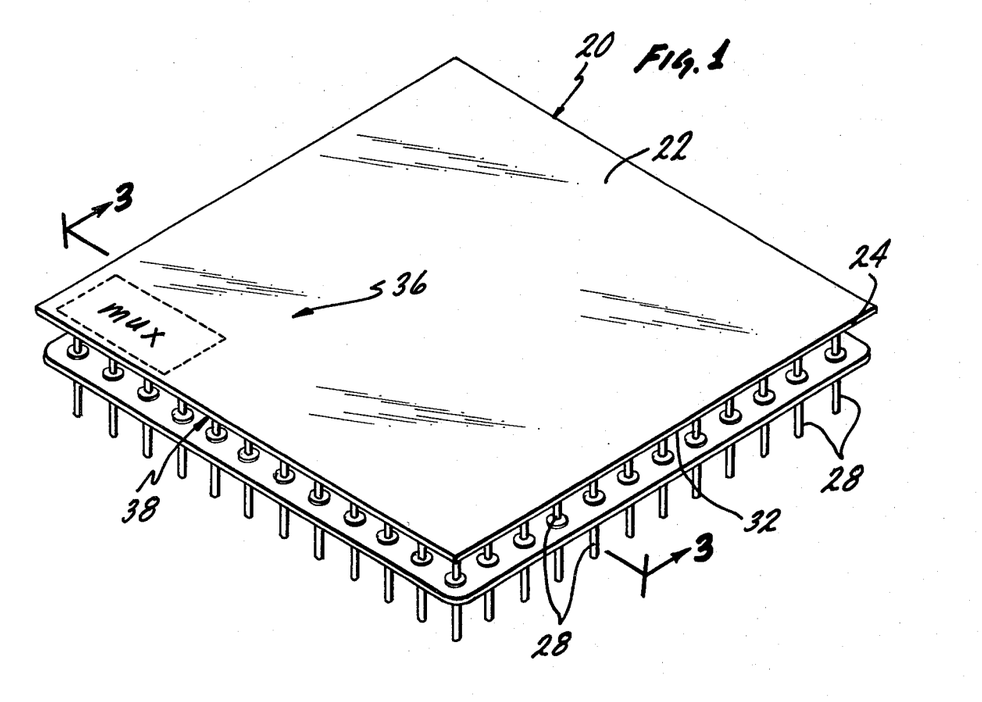
FIG. 1 is top view of an LSI focal plane module.
Figure 2:
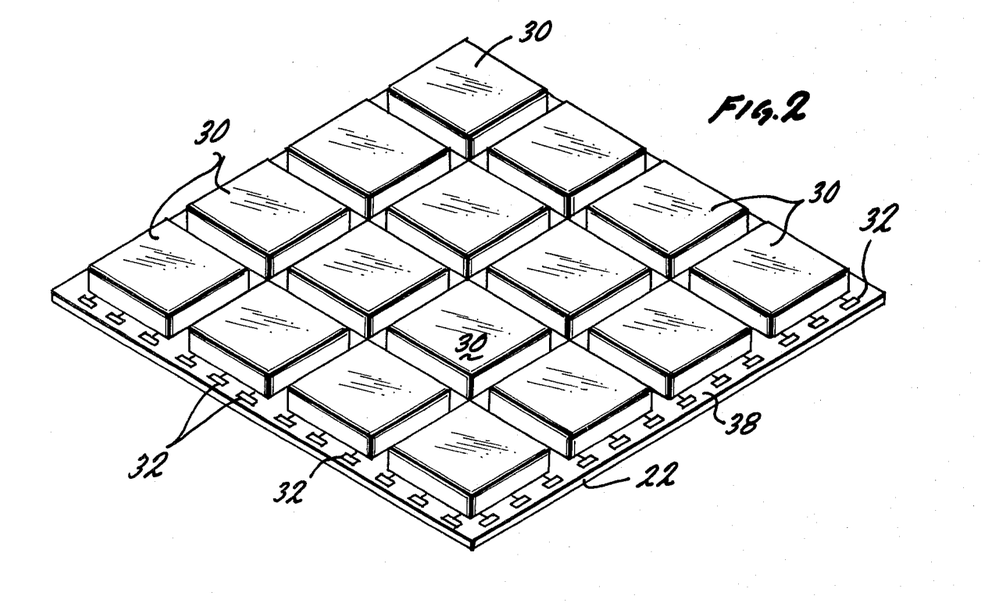
FIG. 2 is a bottom view of the same module.

In FIG. 1 is illustrated a focal plane module 20 with an indium doped silicon detector substrate 22. Substrate 22 is grown by the Czochralsky method with a net acceptor concentration on the order of 0.8 to $3.0 \times 10^{17}$ cm$^{-3}$, and its thickness 24 may be about 500 microns. Such a thickness has been found to be easily workable and highly functional.

Silicon substrate 22 is oxidized on rear surface 38 whereafter small openings 78 (FIG. 4) are etched through oxide layer 40 and a detector impurity diffused, or otherwise implanted, into substrate 22 there. Such implantations 58 form photodetective junctions, referred to as "pixels" 60.

Figure 4:
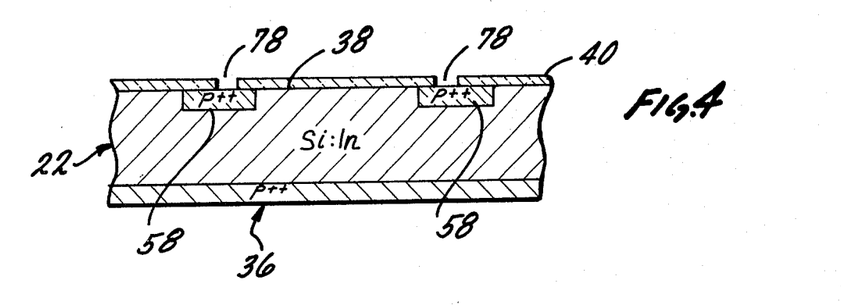
FIG. 4 is a sectional view of the invention's silicon substrate showing its positive doped front surface 36 and detector islands 58 of positive dopant in the insulative oxide cover 40 of its rear side.
Figure 5:
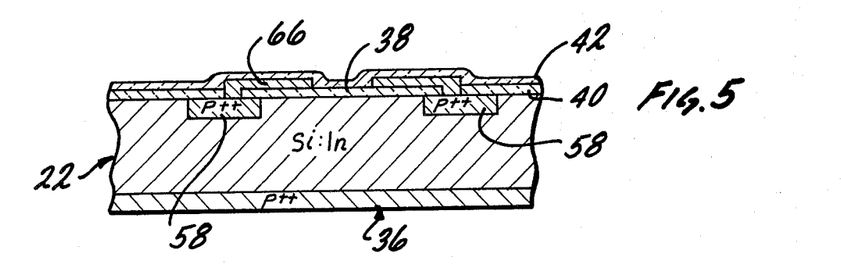
FIG. 5 shows a metallic layer 66 in contact with photodetector islands 58 and a second oxide layer 42.
Figure 6:
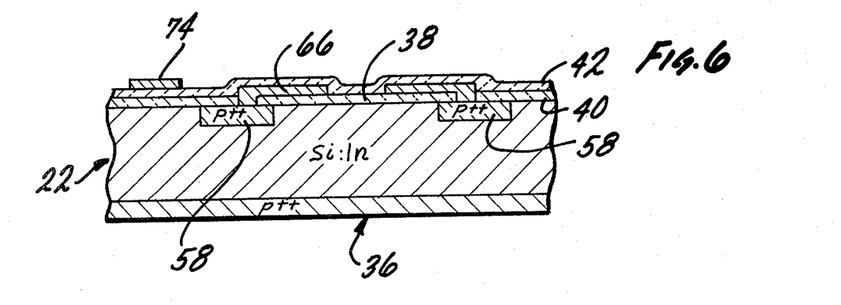
FIG. 6 shows a second metallic layer 74.
Figure 7:
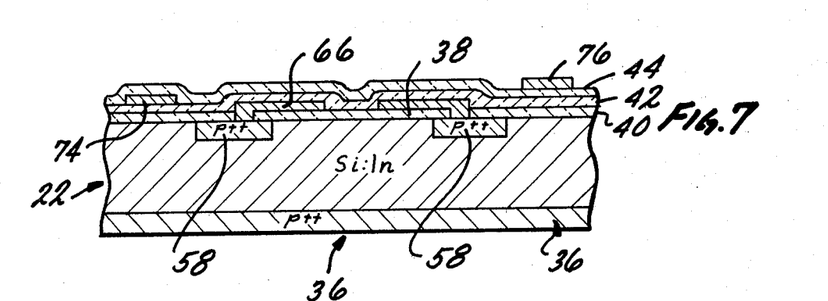
FIG. 7 shows a third oxide layer 44 and third metallic layer 76.
Figure 8:
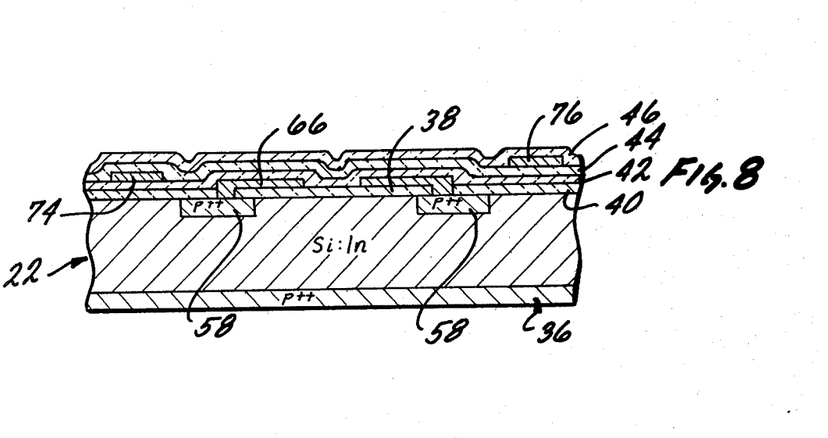
FIG. 8 shows the final oxide layer 46.

Pixels may be formed by generating an ordered pattern of voids or openings in silicon dioxide layer 40 of wafer 22 rear surface 38 and by then using conventional processes for placement of the detecting impurity through ion implantation or diffusion processes at the void.

Openings are etched through silicon dioxide rear surface layer 40 through use of photolithographic masks and etchants such as 0.1 Normal Hydrofluoric Acid.

Various types of impurity may be impregnated or diffused into these small openings to form photodetective junctions 58. Such junctions then become photodetectors 60 with spectral response determined by characteristics of the impurity.

Typical spectral response for impurities are a maximum for zinc at a signal wavelength of 3 microns, Selenium at 4.2 microns, Indium at 7.5 microns and gallium at 14 microns. Selective utilization of dopants can provide polychromatic data and, with proper sequencing of sampling and processing, provide colored reproduction of sensed target images.

Figure 3:
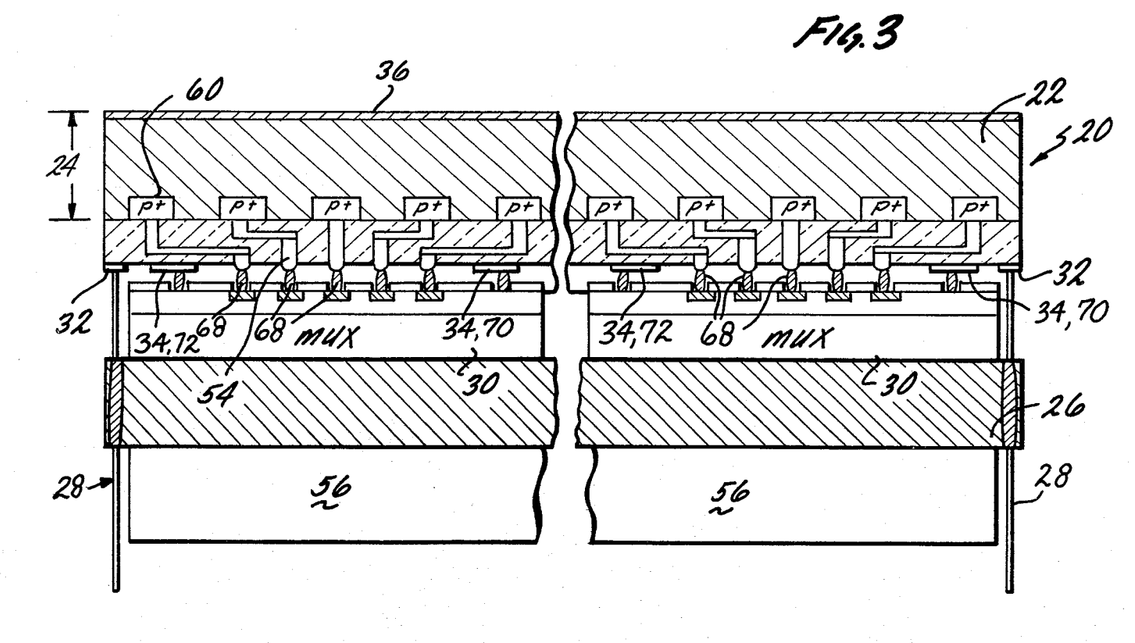
FIG. 3 is a sectional schematic view of a segmented LSI focal plane.

In FIG. 3 is shown a substrate header 26. Not shown, but required for operation of the infrared detectors of this invention, is a cryogenic cooler 56 which would normally be in good thermal contact with header 26. One of the short advanges of this focal plane is the short thermal path between cooler 56 and photodetectors (pixels) 60. Cooler 56 chills header 26 which, in turn, chills multiplexer 30. Multiplexers 30 are operated at cryogenic temperatures between 45 and 55 degrees Kelvin. At these temperatures, silicon units (MUXs) 30 become highly efficient heat couplers between pixels 60 and cooler or heat sink 56. Heat generated by MUX output FET's (Field Effect Transistors) is readily shunted to heat sink 56 allowing the heat sensitive pixels to operate at their optimal, cyrogenic, temperature. Metal pins 28 also help transfer heat, conductively, from pixels 60 in substrate 22 to maintain them at the low temperature required for their effective operation. Such detectors perform best at cryogenic temperatures, and cooler 56 may be chilled by liquid helium, liquid hydrogen, other cryogenic material or a refrigerator device capable of maintaining such cryogenic temperatures.

Figure 12:
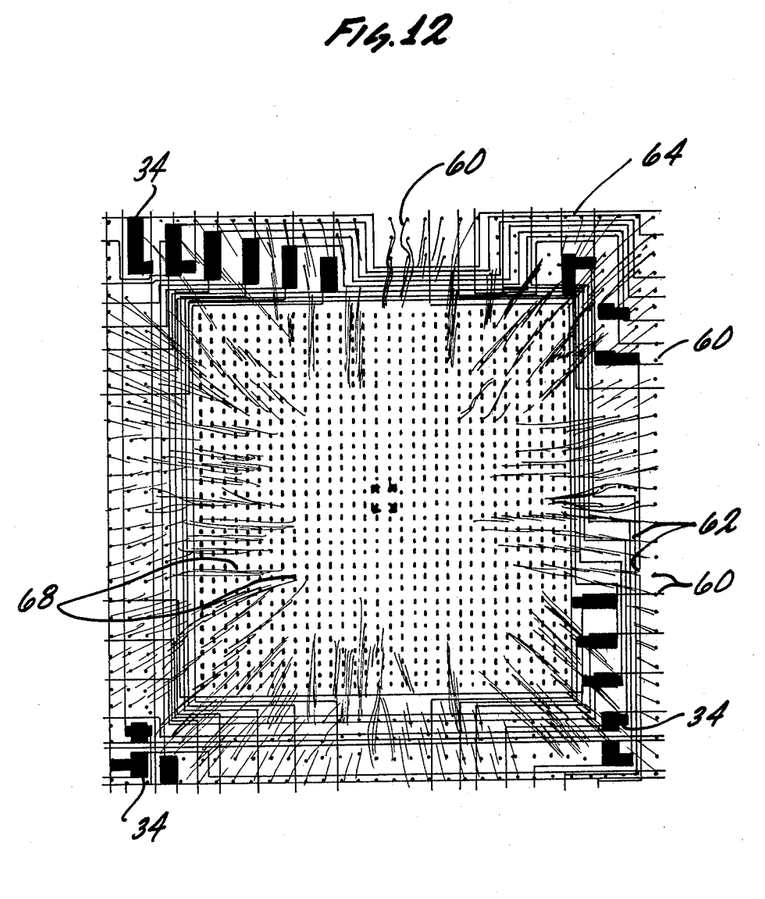
FIG. 12 is a bottom view of a focal plane segment showing a single CCD multiplexer and operational buses 62 deposited on final oxide layer 46 of FIGS. 8 and 9.

Module 20 may be supported, in an operational surveillance system, by module output pins 28. These pins are generally of metal and serve as electrical conductors between bus lines 62 (FIG. 12). Output lines 64 and system signal processing equipments which may well be telemetry system signal conditioners (not shown). Pins 28 also help conduct heat from substrate 22 to header 26. Pins 28 run between processing equipments in the system and conductive pads 32 on rear surface 38. These pads, in turn, may be connected to signal, timing or power buses 62, 64, at pads 34, for multiplexer 30 operation.

Integration of CCD multiplexers 30 and substrate 22 into module 20 provides an independent focal plane with dimensions set by the size of substrate 22. A plurality of such modules might well be combined into a focal plane of extended dimensions. Limitations to physical extent of such a combination might well be set by physical optics used with the surveillance system.

In such a "multi-module" system, special sampling equipments are required to sequence individual CCD MUX outputs into a pattern consistent with desired system output presentation. Areas of interest in a target image might be scanned 5 to 50 times more frequently than other areas of lesser interest and a variety of sampling and presentation schemes is open to the designer.

A most important feature of these modules is that each presents an electrical output corresponding to the entire field of view in that module's part of the focal plane. No "dead space" is present in which target detail is lost. Tracks of moving targets can be reproduced in detail as they are being produced in the target region of surveillance. Resolution of such presentations is limited only by precision of the physical optics system and by spacing between (viz. "density" of) photosites or pixels 60 on rear surfaces 38 of wafers 22.

Focal plane module 20 of this invention shows an index of reliability substantially greater than that of other hybrid type focal planes. In most other systems, bonded wires connect the discrete devices to circuit pads of the CCD's. Opening of these bonds is a common failure mode overcome by this invention. In this invention, CCD multiplexers 30 of a given module 20 are bonded directly to a metalization pattern on rear surface 38 of substrate 22. No open bonds are likely with such a solid, close packed and mechanically well supported array. Failure of a given bus line 62, 64 at connection point 34 will not stop multiplexer operation since buses are double ended and terminate either end at the voltage or timing source required.

FIGS. 4 through 9 show the sequence of plating-/etching operations used for building substrate 22 into the LSI focal plane of this invention. A preferred embodiment utilizes an array of detectors 60 which are spaced approximately 125 microns apart on surface 38. Such spacing may be made uniform over the entire surface 38, continuing in uniformity along all edges of wafer 22 so that abutting modules present minimal discontinuities in a focal plane comprised of a plurality of modules.

Such spacing is controlled by photo etch/mask techniques well known in the art. When detectors 60 are formed with the impregnation or diffusion of impurities as described above, a layer of aluminum 66 is deposited on the detector islands and, through proper masking technology, is selectively dissolved, leaving an aluminum strip 66 connecting such detectors to preordered positions on insulative layer 40.

Such a preordered position will be that directly below an input terminal 68 of CCD multiplexer 30. CCD multiplexers 30 have such input terminals spaced slightly closer together than pixels 60.

Figure 10:
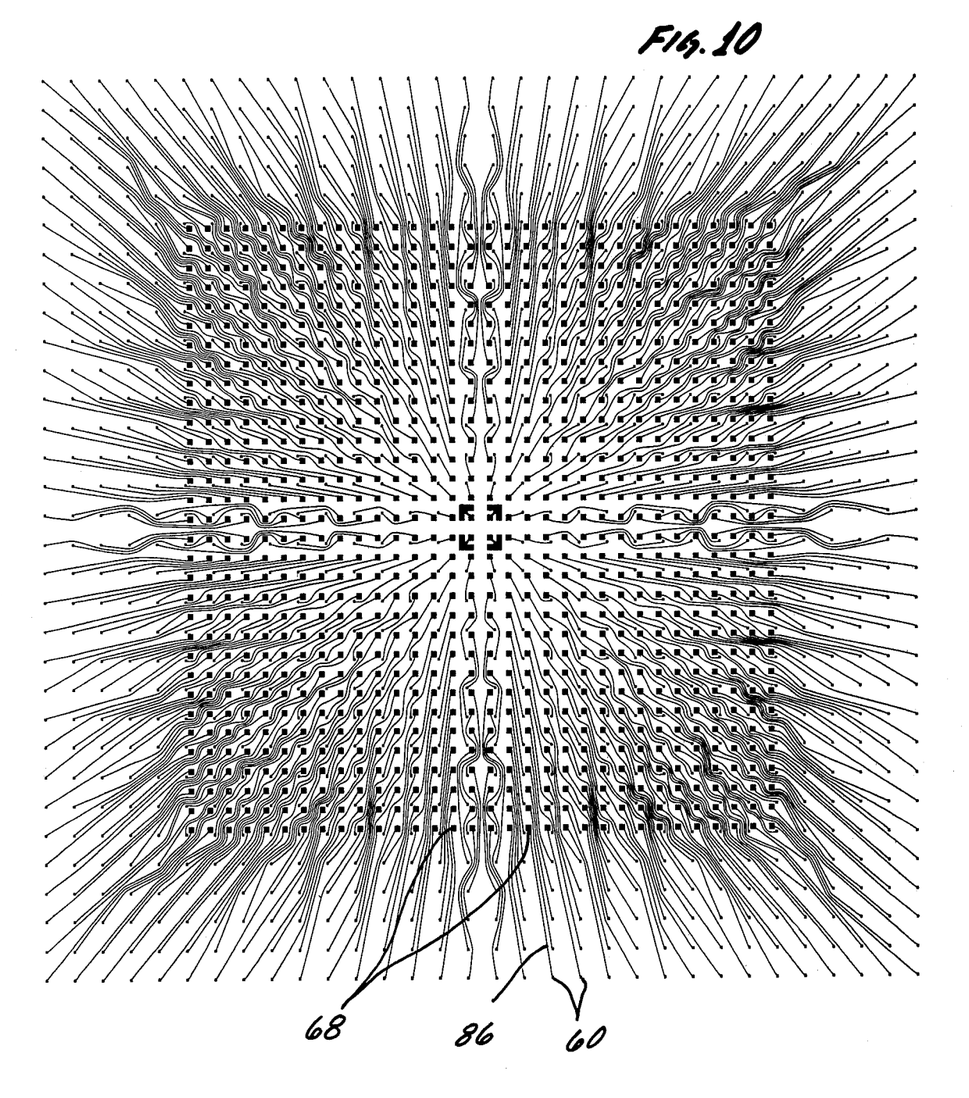
FIG. 10 shows the fan-in pattern of metallic leads 86 between photodectors 60 (small dots) and CCD input terminals 68 of CCD multiplexers (square units).

FIG. 10 shows aluminum strips 86 running between pixels 60 and multiplexer input terminals 68. Such strips 86, aluminum plating 66, and bus lines 62 and 64 may be as thin as one micron and of such width as is required in the most congested area of the fan in patterns of FIGS. 10 and 11. Such widths may be as small as five microns, in accordance with the design rules of standard integrated circuit processing.

Figure 11:
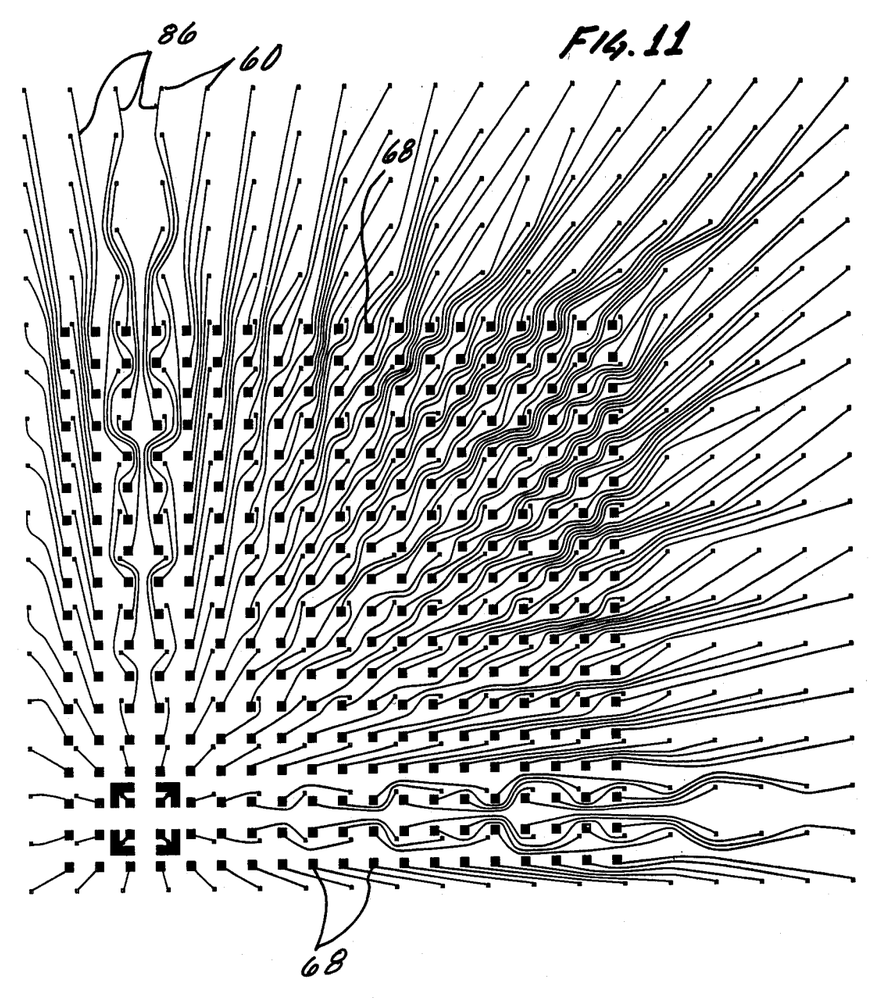
FIG. 11 is a quarter section of the FIG. 10 unit showing "fan-in" detail.

One of the principal features of this invention is the "fan-in" pattern shown in FIGS. 10 and 11, of aluminum strips 86 between detectors 60 on, e.g. 125 micron centers, and multiplexer input terminals 68 comprising soft solder spots on, e.g. 88 micron centers. Such a pattern is built from conventional photolithographic mapping masks, vapor deposition and selective use of photoresist and etchants.

Aluminum strips 66 terminate in bumps, or conductive columns, 54 which are at the "preordered positions" referred to above.

Multiplexers 30 have solder terminals 68 spaced regularly to mate with conductive columns 54. Solder terminals 68 of multiplexers 30 are placed over columns 54 and while held so, in precision alignment, the multiplexer 30 and substrate 22, are flip chip bonded through columns 54 in an appropriate brazing atmosphere.

Multiplexer terminals 68 are represented by small squares in FIGS. 10 and 11, while detectors, or pixels 60, are represented by smaller dots. FIGS. 10 and 11 illustrate a significant feature of the invention in the means used to fan in conductors 86 from 125 micron centered pixels 60, to 88 micron centered multiplexer input terminals 68.

By brazing multiplexers 30 directly to columns 54 of the substrate, a sturdy array is achieved for use in the less than hospitable environments of space surveillance systems.

Figure 9:
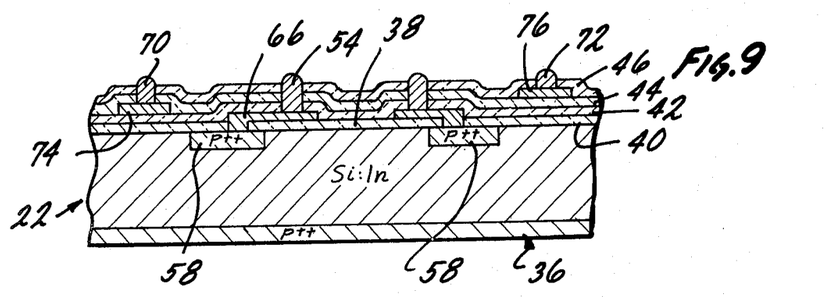
FIG. 9 shows the etched oxide layers and metallic columns 54, 70, 72 formed in the etchings.

FIG. 9 shows certain conductive columns as terminals 70 and 72 not associated with pixels 60 and multiplexer input terminals 68. Column 70 may be the terminal of a power, signal or timing bus 74, which runs to an output pin 28 and thence to system sources. Similarly, column 72 may well be the multiplexer terminus of a video signal bus 76 which also couples to an output pin 28 and thence to system processor equipments.

Processes associated with FIGS. 4 through 9 are not described in detail since they are well established and broadly utilized within the semiconductor industry.

What I claim is:

1. A wafer of properly doped photoconductive semiconductor material having a front and rear surface and a first plurality of charge coupled device multiplexers having input terminals;

said front surface being transparent to electromagnetic energy in the frequency range of photoconductivity of said wafer and being electrically conductive to electromagnetic energy of at least some lower frequency;

heat sink means in good thermal contact with said wafer rear surface;

said rear surface having a second plurality of photodetectors integral with said wafer and disposed uniformly thereover in such a fashion that distance between adjacent photodetectors is greater than the distance between adjacent input terminals of said multiplexers, distance between detectors closest to a rear surface edge and the edge itself being half the distance between adjacent detectors;

an insulative layer deposited over said rear surface having electrically conductive columns thereon so disposed as to be directly opposite said input terminals of said multiplexers; and electrical conductor means coupling said photodetectors to said conductive columns, said conductive columns being mechanically bonded and electrically coupled to said input terminals.

2. The combination, recited in claim 1, wherein said photoconductive semiconductor material is silicon doped with Indium at a concentration of from 0.8 to $3.0 \times 10^{17}$ Indium atoms per cubic centimeter.

3. The combination recited in claim 1 wherein said photodetectors comprise deposits of material having different spectral response.

4. The combination recited in claim 1 wherein said photodetectors comprise deposits of one of the materials taken from the class composed of Selenium, Indium and Gallium.

5. The combination recited in claim 3 wherein said photodetectors are comprised of deposits of more than one type of chemical composition and wherein said different compositions display different response to a given intensity and frequency of electromagnetic energy impingeant thereon.

6. The combination recited in claim 1 including a structural case having electrically conductive pins, said pins capable of providing operational power and other electrical signals to the combination from sources in external signal processing systems with which said combination is used, with said combination attached to and physically supported by said structural case.

7. The combination recited in (C) claim (3) 1 including a structural case having electrically conductive pins useable for mounting said combination to structure and for coupling operational power and signal voltages between said combination and external signal processing systems.

8. The combination recited in claim 6 including a structural case having electrically conductive pins useable for mounting said combination to structure and for coupling operational power and signal voltages between said combination and external signal processing systems.

9. The combination recited in claim 8 wherein said multiplexers and structural case do not intrude into space beyond the outermost photodetectors of said wafer.

10. The combination recited in claim 8 wherein said multiplexers and structural case do not intrude into space beyond the outermost photodetectors of said wafer.

11. A plurality of the combination recited in claim 7, so mounted to structure as to have said combinations adjacent each other in edge to edge array useable as a focal plane.

12. A photo-electric sensor comprising, in combination, a wafer of intrinsic semiconductor material having a front and a rear surface, a first plurality of photovoltaic detectors disposed over said rear surface in a uniformly spaced linear array, said detectors integral with said wafer, a layer of insulative material covering said photovoltaic detectors, electrically conductive columns disposed on said layer, and electrical conductor means coupling each photovoltaic detector to one of such columns, and a second plurality of multiplexer means having input terminals and disposed uniformly thereover in such a fashion that distance between adjacent photodetectors is greater than the distance between adjacent input terminals of said multiplexers, distance between detectors closest to a rear surface edge and the edge itself being half the distance between adjacent detectors, each input terminal so disposed as to be directly opposite one of said conductive columns and being electrically and mechanically bonded to such column.

13. The sensor of claim 12 including a structural case having electrically conductive pins useable for mounting said sensor to structure and for coupling operational power and signal voltages between said sensor and external signal processing systems.

14. The sensor recited in claim 13 wherein said multiplexers do not intrude into space beyond the outermost detectors of said wafer.

15. The sensor recited in claim 14 so mounted to structure as to form an edge to edge array with similar combinations, the totality of such combinations comprising a focal plane with no dead space thereon.

* * * * *